US007510942B2

(12) United States Patent
Dey et al.

(10) Patent No.: US 7,510,942 B2
(45) Date of Patent: Mar. 31, 2009

(54) MOLECULAR MODIFICATIONS OF METAL/DIELECTRIC INTERFACES

(75) Inventors: Sandwip K. Dey, Phoenix, AZ (US); Diefeng Gu, Tempe, AZ (US); Rizaldi Sistiabudi, Tempe, AZ (US); Jaydeb Goswami, Boise, ID (US)

(73) Assignee: Arizona Board of Regents, Acting for and on behalf of Arizona State University, Tempe, AZ (US)

( * ) Notice: Subject to any disclaimer, the term of this patent is extended or adjusted under 35 U.S.C. 154(b) by 27 days.

(21) Appl. No.: 10/997,641

(22) Filed: Nov. 24, 2004

(65) Prior Publication Data
US 2005/0127461 A1 Jun. 16, 2005

Related U.S. Application Data

(60) Provisional application No. 60/525,281, filed on Nov. 25, 2003.

(51) Int. Cl.
*H01L 21/336* (2006.01)
(52) U.S. Cl. .................. 438/287; 438/239; 438/783; 438/790; 257/E29.345
(58) Field of Classification Search .............. 438/3, 438/239–242, 287, 770–794; 257/E29.345
See application file for complete search history.

(56) References Cited

U.S. PATENT DOCUMENTS

| 4,192,925 | A | * | 3/1980 | Schafer et al. | 521/163 |
|---|---|---|---|---|---|
| 5,405,766 | A | * | 4/1995 | Kallury et al. | 435/174 |
| 6,468,657 | B1 | * | 10/2002 | Hou et al. | 428/403 |
| 6,770,586 | B2 | * | 8/2004 | Tashino et al. | 502/127 |
| 2002/0128234 | A1 | * | 9/2002 | Hubbell et al. | 514/100 |
| 2003/0142901 | A1 | * | 7/2003 | Lahann et al. | 385/18 |
| 2003/0180966 | A1 | * | 9/2003 | Abbott et al. | 436/518 |
| 2004/0001778 | A1 | * | 1/2004 | Chen et al. | 422/88 |
| 2004/0072360 | A1 | | 4/2004 | Naaman et al. | |
| 2004/0101477 | A1 | * | 5/2004 | Leyland-Jones | 424/9.2 |
| 2004/0110350 | A1 | * | 6/2004 | Pang et al. | 438/299 |
| 2004/0185600 | A1 | * | 9/2004 | Kagan et al. | 438/99 |
| 2005/0087444 | A1 | * | 4/2005 | Chang et al. | 204/450 |

OTHER PUBLICATIONS

Ashkenasy et al., "Molecular Engineering of Semiconductor Surfaces and Devices", Acc. Chem. Res., 35(2):121-128, 2002.

(Continued)

*Primary Examiner*—H. Jey Tsai
(74) *Attorney, Agent, or Firm*—McDonnell Boehnen Hulbert & Berghoff LLP

(57) ABSTRACT

A method of increasing the work function of micro-electrodes includes providing a metal or silica surface functionalized with reactive groups and contacting the functionalized surface with a solution of at least one biochemical, having a permanent dipole moment and being capable of self assembly, for a sufficient time for the biochemical to self assemble molecularly (SAM) on the functionalized surface. The biochemical can be aminopropyl triethoxy silane, fatty acids, organosilicon derivatives, organosulfur compounds, alkyl chains, or diphosphates. Use in a wide variety of metals and metallic compounds is disclosed.

9 Claims, 6 Drawing Sheets

OTHER PUBLICATIONS

Cahen et al., "Molecules and Electronic Materials", Adv. Mater., 14(11):789-798, 2002.

Cluzel et al., "Electrical characterization of low permittivity materials for ULSI inter-metal-insulation", Microelectronics Reliability, 40:675-678, 2000.

Dey et al., "Relationships among equivalent oxide thickness, nanochemistry, and nanostructure in atomic layer . . .", J. App. Phys., 95(9):5042-5048, 2004.

Hauser et al., "Characterization and Metrology for ULSI Technology", 1998 International Conference, edited by D.G. Seiler et al., (The American Institute of Physics, Melville, NY) pp. 235-239, 1998.

Ratner, B., "Surface modification of polymers: chemical, biological and surface analytical challenges", Biosensors & Bioelectronics, 10:797-804, 1995.

Salomon et al., "Comparison of Electronic Transport Measurements on Organic Molecules", Adv. Mater., 15(22):1881-1890, 2003.

Takahagi et al., "Computer-Aided Chemistry Estimation Method of Electronic-Polarization Dielectric Constants for the Molecular Design of Low-k Materials" Jpn. J. Appl. Phys. 42:157-161, 2003.

Immobilized Biomolecules in Analysis: A practical approach, Cass et al., Editors, Oxford University Press, pp. 1-14, 1998.

Biomaterial Science: An introduction to materials in medicine, Ratner et al., Editors, Academic Press, pp. 105-117, 1996.

* cited by examiner

MOLECULAR MODIFICATIONS OF METAL/DIELECTRIC INTERFACES

CLAIM TO DOMESTIC PRIORITY

The present non-provisional patent application claims the benefit of provisional application Ser. No. 60/525,281 entitled "Molecular Modifications of Metal/Dielectric Interfaces", filed on Nov. 25, 2003.

FIELD OF THE INVENTION

The present invention relates in general to modifying metal/insulator, metal/semiconductor, and metal/metal interfaces for the purpose of molecular electronics and biodevices and more specifically to biochemical deposition on such interfaces to increase the work function of the interface.

BACKGROUND OF THE INVENTION

The use of organic molecules to modify the interface between metal and high-permittivity (K) material is a recent development that has a wealth of potential applications in microelectronics, optoelectronics and in the rapidly growing area of molecular electronics and bio-nanodevices. In terms of molecular control over electronic device properties, there have been two main approaches a) control of the electrical potential at the interface (electrostatics) and b) control of charge transport across the interface (electron dynamics). Relying on electrostatics instead of dynamics may be advantageous with respect to stability and reliability.

A GaAs sensor and Au—Si and Au—GaAs diodes have been demonstrated by incorporating molecules at such interfaces. In biological applications, SAMs have been primarily used as surface modifiers; the surface hydrophobicity and hydrophilicity is contingent on the type of SAM, which allows the control of biological host response such as biocompatibility and biodegradability. Another growing use of the SAM is activating a surface for subsequent chemical reaction, such immobilizing antibodies for biosensors.

In the future, the integration of high permittivity (K) gate dielectric films in complementary metal-oxide-semiconductor (CMOS) devices (i.e., field effect transistor or FET) will determine the minimum obtainable equivalent oxide thickness (EOT), as well as the drive performance, density and reliability. Soon, the deposition of gate metals on high K gate dielectrics (to completely eliminate $EOT_{gate}$) will be needed. However, the work functions ($\phi_m$) for n-MOSFETs (e.g. Al, Zr, Ti) and p-MOSFETs (e.g., Pt, Re, Ir) must precisely be controlled within $E_c \pm 0.2$ eV and $E_v \pm 0.2$ eV, where $E_c$ and $E_v$ are the conduction and valence band edge energies, respectively. This requirement arises because the flexibility in the control of low transistor threshold voltages ($V_T$) is primarily offered by the control of the flat band voltages ($V_{FB}$), which in turn are a function of the $\phi_m$ of various metals.

The production of such dual-metal MOSFETs will not only introduce additional process complexities (deposition/etching) and issues of yield, the potential for interfacial reactions of low electronegativity metals with high K dielectrics could lead to non-zero values of $EOT_{gate}$, as well as a change in the effective $\phi_m$ of metals. Therefore, there needs to be an alternative solution to tuning specific metals. It also would be highly desirable to eliminate the use of dual metals in CMOS with high K dielectrics.

SUMMARY OF THE INVENTION

An object of the present invention is to selectively tune specific metals by the use of self assembled organic molecules, sandwiched between the specific metal and a high permittivity gate dielectric.

Another object of the invention is to eliminate the use of dual metals in complementary metal-oxide semiconductor devices, which could significantly expand the ability to tailor the behavior of microelectronics, optoelectronics and bio-nanodevices.

In one embodiment, a method of improving the electrical characteristics of metal-insulator-semiconductor (MIS) or metal-insulator-metal (MIM) structures has the steps of providing a metal or silica surface functionalized with reactive groups and contacting the functionalized surface with a solution of at least one selected biochemical having a permanent dipole moment and being capable of self assembly for a sufficient time for the biochemical to self assemble molecularly (SAM) on the functionalized surface. The biochemical can be aminopropyl triethoxy silane, fatty acids, organosilicon derivatives, organosulfur compounds, alkyl chains, diphosphates or a combination thereof.

In addition, the functionalized surface can be formed from at least one surface of TaN, $TaSi_xN_y$, TiN, $TiAl_xN_y$, $WN_x$, MoN, RuTa, $RuO_2$, $IrO_2$, $TaSi_2$, $TiSi_2$, $WSi_2$, or $MoSi_2$. Before the contacting step, there can be another step of activating molecules on the functionalized surface.

In another embodiment, there is a method of improving the electrical characteristics of MIM or MIS structures that includes providing a metal surface and contacting the metal surface with a solution of at least one selected biochemical having a permanent dipole moment and being capable of self assembly for a sufficient time for the biochemical to self assemble molecularly (SAM) on the metal surface. The SAM can be aminopropyl triethoxy silane, fatty acids, organosilicon derivatives, organosulfur compounds, alkyl chains, diphosphates or a combination thereof. The metal can be at least one of Ta, Ti, Ni, Co, W, Mo, Ru, Ir, Pt, Al, Cr, Pd, Re, Ar or Ha. Before the contacting step, there can be another step of activating molecules on the metal surface.

In another embodiment, a micro-electronic device includes a. a metal or metallic combination having at least one surface; b. on the at least one metal surface an organic compound surface having been formed by self assembly of permanently dipolar molecules; and c. an electrode contacting the organic compound surface. The metal or metallic combination is selected from TaN, $TaSi_xN_y$, TiN, $TiAl_xN_y$, $WN_x$, MoN, RuTa, $RuO_2$, $IrO_2$, $TaSi_2$, $TiSi_2$, $WSi_2$, $MoSi_2$, Ta, Ti, Ni, Co, W, Mo, Ru, Ir, Pt, Al, Cr, Pd, Re, Ar, Ha and a combination thereof.

In another embodiment, a method of improving the electrical characteristics of metal-insulator-semiconductor (MIS) or metal-insulator-metal (MIM) structures has the steps of providing a silica surface functionalized with $SiO_2$ and contacting the functionalized surface with a solution of aminopropyl triethoxy silane (APTES) for a sufficient time to allow the APTES molecules to self assemble. Before the contacting step, there is a step of activating the functionalized surface. The funtionalized surface may be activated by exposure to isopropyl alcohol and/or acetone, by boiling in water or by plasma treatment. The sufficient time to allow the APTES molecules to self assemble is about one hour. An electrode can be applied to the APTES surface.

BRIEF DESCRIPTION OF THE DRAWINGS

FIG. 6 is a graph illustrating the increase in measured work function of Ti on SiO$_2$ a SAM layer in between.

DETAILED DESCRIPTION OF THE DRAWINGS

The present invention involves a self-assembled monolayer (SAM) of molecules sandwiched between metal and dielectric to improve the electrical characteristics of bio-nano-devices based on metal-insulator-semiconductor (MIS) or metal-insulator-metal (MIM) structures. Through this approach the properties of solid surfaces are "tuned" through deposition of self-assembled monolayers (SAM) of organic molecules to yield hybrid, multifunctional systems, a synergistic combination of the molecular and non-molecular worlds. Specifically, systematic substitutions of different functional groups within an organic molecule are used to tailor both the magnitude of the dipole moment and its direction on a solid surface. The degree of surface coverage by the molecules and their tilt relative to the normal surface are also critical on a solid surface. For example, a molecularly based system can potentially tune the electrical characteristics (e.g., equivalent oxide thickness or EOT, flat band voltage or V$_{FB}$, work-function, and leakage current) of CMOS gate-stacks with a simplified production technology. Moreover, novel biosensors can be designed based on soft-mode hardening (i.e., the change in the eigen-frequency of the transverse optical phonon mode) in perovskite-based, nonlinear dielectrics (e.g., (Ba,Sr)TiO$_3$, Pb(Zr,Ti)O$_3$) using polarizable organic molecules.

EXAMPLE 1

SAM of 3-Aminopropyltriethoxysilane (APTES) were used on various dielectric materials including atomic layer deposited (ALD) HfO$_2$ and metal organic chemical vapor deposited (MOCVD) Pb(Zr,Ti)O$_3$. The organic molecules bound strongly to an OH-terminated oxide surface via the following reaction:

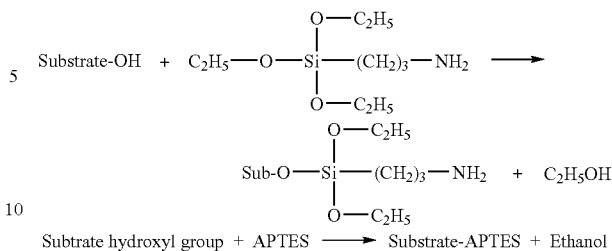

The molecules self-assembled in approximately one monolayer on an oxide surface, when a 10% APTES solution of isopropanol was exposed to an oxide surface for one day. Aluminum top-electrodes were deposited by thermal evaporation using shadow masks.

EXAMPLE 2

Figure 1:
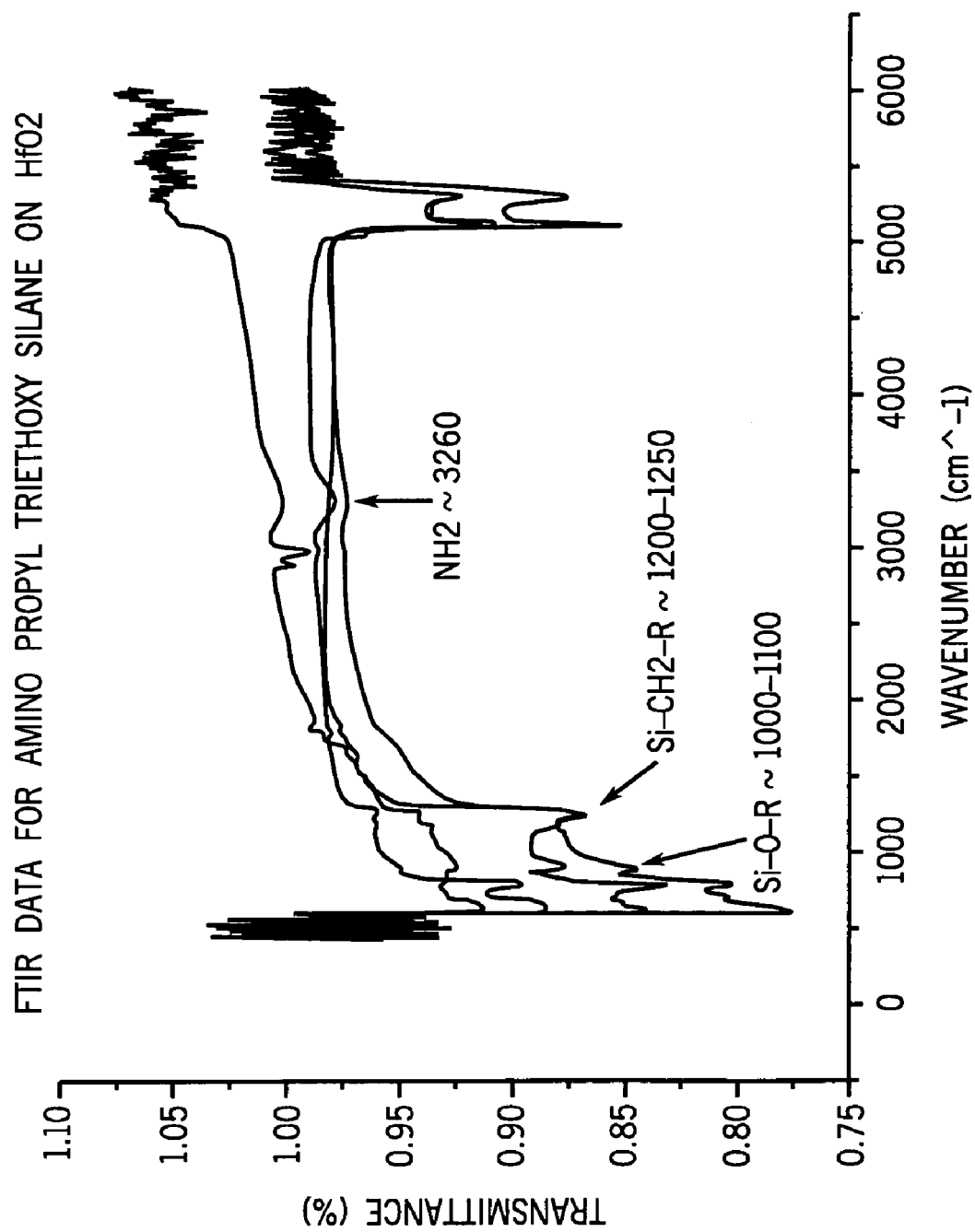
FIG. 1 shows FTIR spectra of APTES deposited on ALD-HfO$_2$ of three different thicknesses, 40 Å, 60 Å, and 90 Å. Also shown is a reference FTIR spectrum of a bare ALD-HfO$_2$ surface.

The binding of SAMs on an oxide surface was confirmed by using Fourier-transform infrared spectroscopy (FTIR). Shown in FIG. 1 are FTIR spectra of APTES deposited on ALD-HfO$_2$ of three different thicknesses, 40 Å, 60 Å, and 90 Å. FIG. 1 also shows a reference FTIR spectrum of a bare ALD-HfO$_2$ surface. The arrows indicate the vibrational energy levels for the important bonds: NH$_2$ (3260 cm$^{-1}$), Si—(CH$_2$)$_3$ (1200-1250 cm$^{-1}$), and Si—O—C$_2$H$_5$ (1000-1100 cm$^{-1}$).

Figure 2:
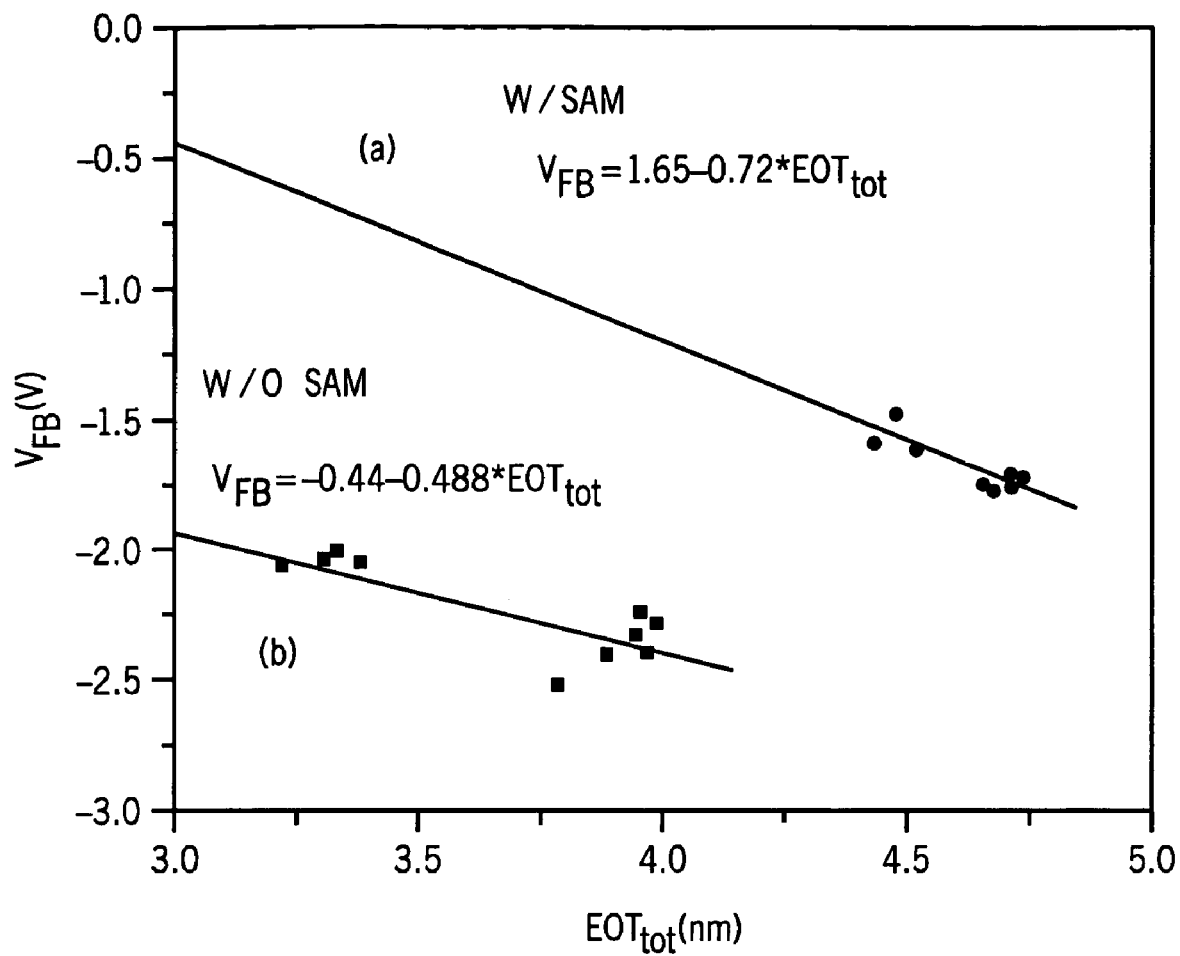
FIG. 2 illustrates V$_{FB}$ as a function of EOT for (a) Al/SAM/HfO$_2$/SiO$_x$/p+-Si and (b) Al/HfO$_2$/SiO$_x$/p+-Si capacitors. The solid lines are linear fits. The electrode area was 100 μm ×100 μm.

In order to estimate the work-function of an aluminum (Al) electrode, the equivalent oxide thickness (EOT) and the flat-band voltage (V$_{FB}$) were calculated from C-V plots in the Al/SAM/HfO$_2$/SiO$_2$/p+-Si configuration for different thicknesses of ALD-HfO$_2$. FIG. 2 illustrates the plots of V$_{FB}$ versus EOT before and after modification of the AL/HfO$_2$ interface by SAM. The slope of the fitted linear-line corresponds to a fixed-charge density (N$_f$). If it were assumed that N$_f$ is located at SiO$_x$/Si interface, the intercept corresponds to the difference in work function ($\phi_{MS}=\phi_M-\phi_S$) between Al and Si. The work-function of Al for the molecularly modified interface was 6.65 eV compared to 4.45 eV for the unmodified Al/HfO$_2$ junctions. This large increase in the work-function of Al is due to the presence of the dipole layer of molecules at the Al/HfO$_2$ interface.

(Ratner and Hoffman in Biomaterial Science: An Introduction to Materials in Medicine, Ed. By Ratner et al. Academic Press, 1996, pp. 105-117; Ratner, Biosensors & Bioelectronics 10: 797-804, 1995).

EXAMPLE 3

A method commonly known as silanization was used to deposit SAM onto thermal SiO$_2$/Si surfaces with a 4 nm SiO$_2$ thickness (t$_{SiO2}$); followed by Ti metal top-electrode deposition by e-beam evaporation. With saturated surface coverage of SAM, the $\phi_m$ of Ti was determined through capacitance-voltage (C-V) analysis. The binding of SAM on SiO$_2$ was confirmed by using Fourier-transform infrared spectroscopy (FTIR) and surface coverage of SAM was determined by the change in V$_{FB}$ with deposition time.

Substrate Preparation: The SiO$_2$ layers (with a thickness t$_{SiO2}$ of 4, 6, and 8 nm) were deposited on Si by a thermal oxidation process at International Sematech (Austin, Tex.). Prior to the deposition of SAM, the removal of organic deposits on these SiO$_2$/Si wafers was carried out by rapid thermal annealing (RTA) at 350° C. for 1 minute using a AG Associates (San Jose, Calif.) Heat Pulse 610, followed by sonication with 70% isopropyl alcohol (in water) for 30 sec and then with acetone for 20 sec. The sonication process served two purposes: to promote the growth of hydroxyl groups and to remove unwanted particles such as dust and contaminants.

Self Assembled Monolayer (SAM): The self-assembled monolayer molecules were deposited onto the $SiO_2/Si$ wafers by chemical bath deposition; a modified version of Shriver-Lake (Immobilized Biomolecules in analysis: a practical approach. Ed.by T. Cass and F. Ligler, New York City, Oxford Press, 1998, pp. 1-14). The precursor solution (5% v/v) was made by mixing aminopropyl triethoxy silane (APTES) and 100% ethanol. For the deposition of SAM, a clean wafer was first rinsed with 100% ethanol and then immersed (for a specific time) in a chemical bath containing 20 mL of this precursor solution. The binding of SAM to the OH-terminated oxide surface can be described by the following reaction:

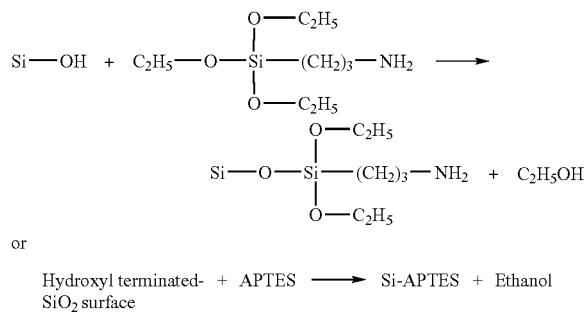

or

Hydroxyl terminated- $SiO_2$ surface + APTES $\longrightarrow$ Si-APTES + Ethanol Following deposition, the wafers were rinsed with 100% ethanol and dried in nitrogen gas (99.99%). For the various surface coverage studies, $SiO_2$ (4 nm)/Si wafers and SAM deposition times of 15, 30, 45, 60 min and 3 hr were used. The time necessary to achieve saturated surface coverage was ~1 hr (described below).

Surface Characterization: The presence of APTES was determined using Fourier transform infrared spectroscopy (FTIR) in the attenuated total reflection (ATR) mode (Bruker IFS 66 V/S). Based on its chemical composition, the vibrational energy regions of interest were 3260 cm$^{-1}$ (corresponding to $NH_2$ absorption), 1000-1100 cm$^{-1}$ (Si—O—R), and 1200-1250 cm$^{-1}$ (Si—CH$_2$—R).

Electrode Deposition and C-V Analysis:

After the SAM formed on the $SiO_2$ surface, circular Ti dots were evaporated by e-beam through a shadow mask to form the top electrode array (100 nm thick, 0.0006 cm$^2$). Ti electrodes were deposited on various coverages of SAM on the $SiO_2$ surface. Al was deposited on the backside of the samples to form a better bottom contact. The high-frequency (100 KHz, $ac_{osc}$ 20 mV) C-V was measured using multi-frequency LCR meter (HP impedance analyzer 4284 A; Palo Alto, Calif.) in parallel mode. The collected C-V data was then analyzed using the Hauser program (J. R. Hauser and K. Ahmed, in CHARACTERIZATION AND METROLOGY FOR ULSI TECHNOLOGY: 1998 International Conference, edited by D. G. Seiler et al (The American Institute of Physics, Melville, N.Y., 1998), pp. 235-39), and the quantum corrected EOT and $V_{FB}$ values were calculated for various surface coverage by the SAM. Here $\phi_m$ of Ti was reported from $V_{FB}$ only at saturated surface coverage.

Results and Discussion

Figure 3:
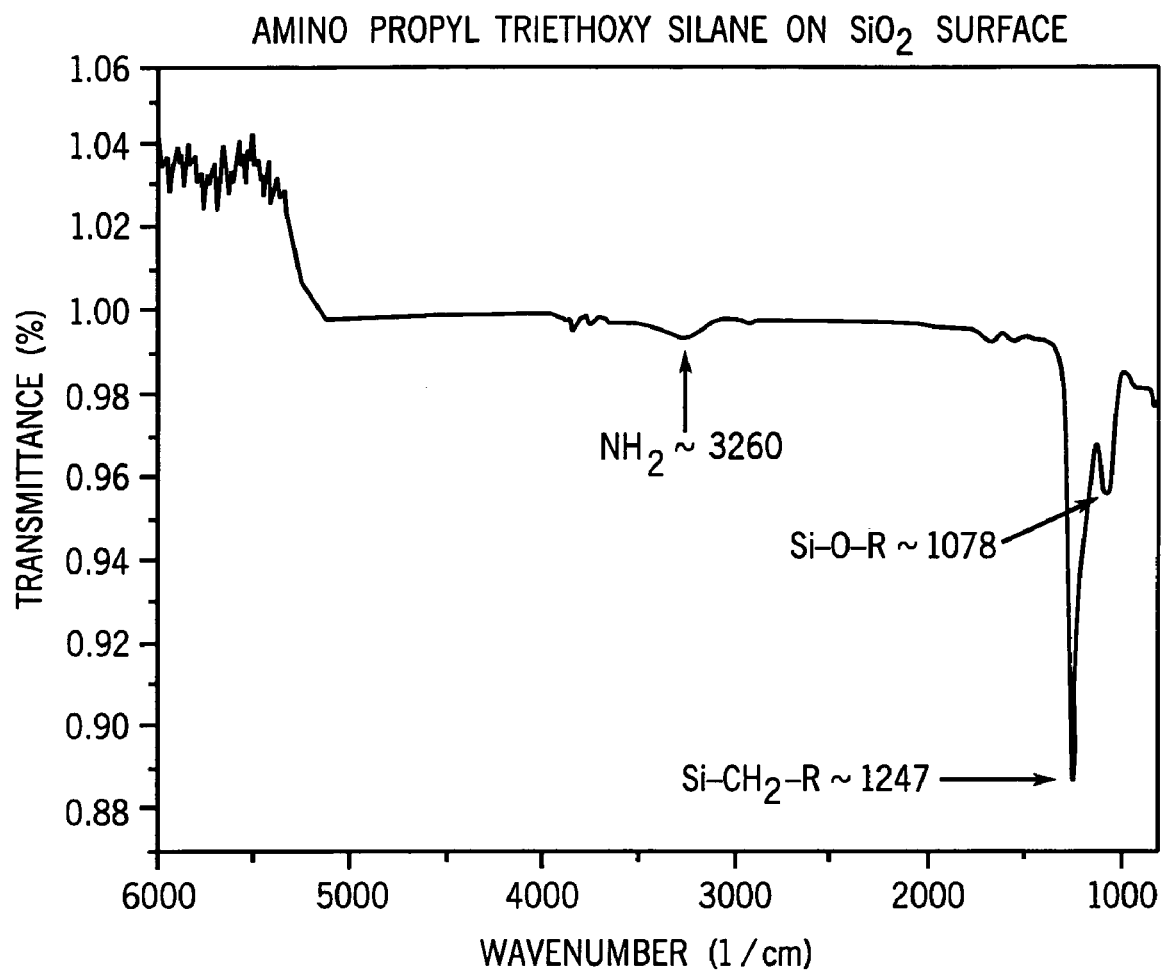
FIG. 3 is a FTIR spectrum of aminopropyl triethoxy silane on an SiO$_2$ surface. Arrows indicate the wavelengths for important bonds of APTES on SiO$_2$.

FIG. 3 shows typical FTIR spectra of APTES deposited on $SiO_2$ showing absorption peaks at 3260 cm$^{-1}$, 1247 cm$^{-1}$, and 1078 cm$^{-1}$, corresponding to $NH_2$, Si—CH$_2$—R, and Si—O—R, respectively. This confirms the presence of APTES on the $SiO_2$ surface.

Figure 4A:
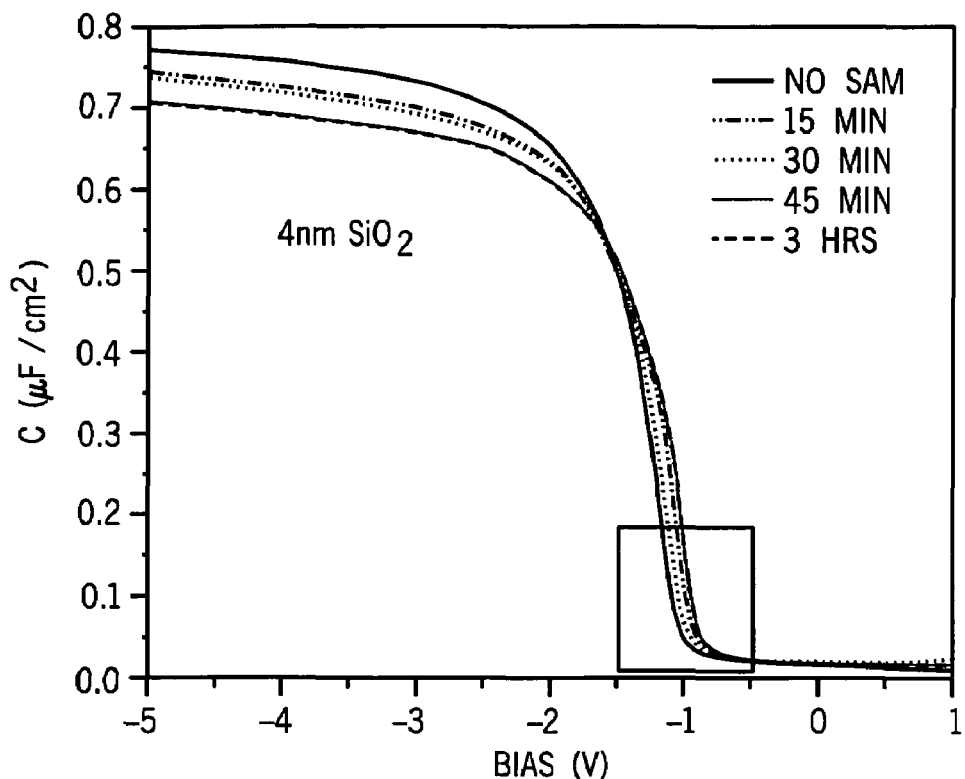
FIG. 4A shows capacitance-voltage (C-V) for a bare SiO$_2$ surface (4 nm thick) and SiO$_2$ surfaces with various surface coverage of SAM.

FIG. 4A shows the C-V curves for bare $SiO_2$ surface (4 nm thick) and $SiO_2$ surface with various surface coverages (indicated by deposition times) of SAM. The decrease in measured $C_{total}$ or increase in total EOT (where $EOT_{total} = \epsilon_0 K_{SiO2}/C_{total} = t_{SiO2} + EOT_{SAM} = t_{IL} + [\{K_{SiO2}/K_{SAM}\} t_{SAM}]$) with deposition time is attributed to greater surface coverage of SAM on $SiO_2$. However, after 1 hr, $C_{total}$ was independent of deposition time, which is indicative of saturated surface coverage of SAM at 1 hr. The values of $C_{total}$ ($EOT_{total}$) for bare $SiO_2$ surface and $SiO_2$ surface with saturated surface coverage were 0.83 μF/cm$^2$ (4.16 nm) and 0.75 μF/cm$^2$ (4.6 nm), respectively.

Figure 4B:
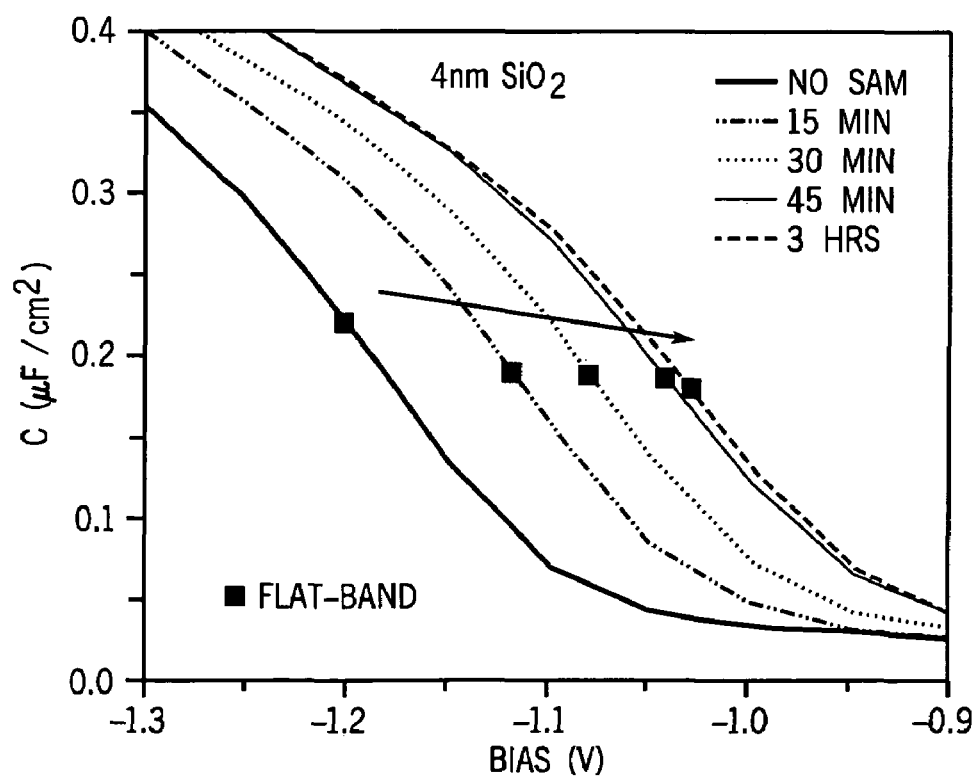
FIG. 4B is the enlarged inset of FIG. 4A and shows the detail at the region around the flat band voltage.
Figure 5:
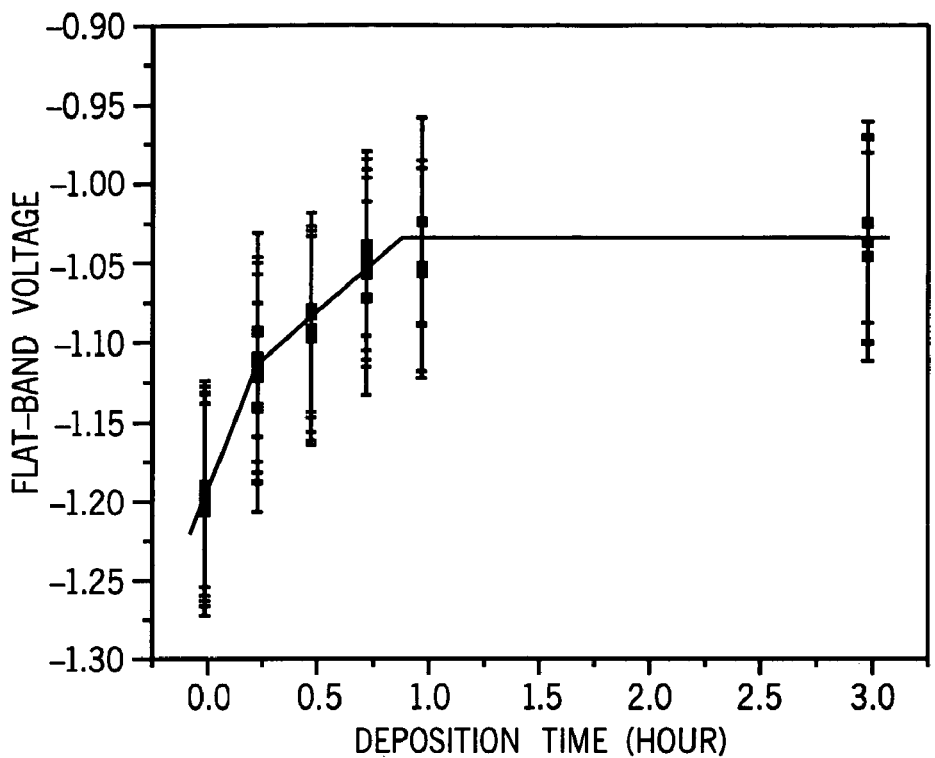
FIG. 5 shows the flat-band voltage as a function of deposition time. The voltage was the same at one and three hours, indicating saturation at about one hour.

FIG. 4B is a magnification of the C-V curves near $V^{FB}$, which also indicates that $V_{FB}$ increases with deposition time. FIG. 5 illustrates a plot of $V_{FB}$ (obtained from six Ti dots) versus deposition time. The initial increase of $V_{FB}$ was rapid, but its rate of increase diminished with deposition time until $V_{FB}$ no longer increased after 1 hr. Independence of $V_{FB}$ after 1 hr of deposition time indicated saturated surface coverage of SAM on $SiO_2$.

The fraction (x) of the $SiO_2$ surface covered with SAM at saturated surface coverage was determined as follows. Since the values of $EOT_{total}$ for bare $SiO_2$ surface and $SiO_2$ surface with saturated surface coverage, as well as thickness of SAM ($t_{SAM}$~0.67 nm; [28]) and $K_{SiO2}$ (3.9) are known, the relationship between $K_{SAM}$ and x (where, 0<x<1) is found to be:

$$x = 0.15 K_{SAM} + 0.09$$

Assuming that $K_{SAM}$ is in the range of 2-3 T. Takahagi et al. Japanese J. Appl. Physics 421(1): 157-161, 2003; J. Cluzel et al. Microelectronics Reliability 40 (4-5)L 675-78, 2000, the fraction (x) of the $SiO_2$ surface covered with SAM at saturated surface coverage is calculated to be 0.39-0.54.

Figure 6:
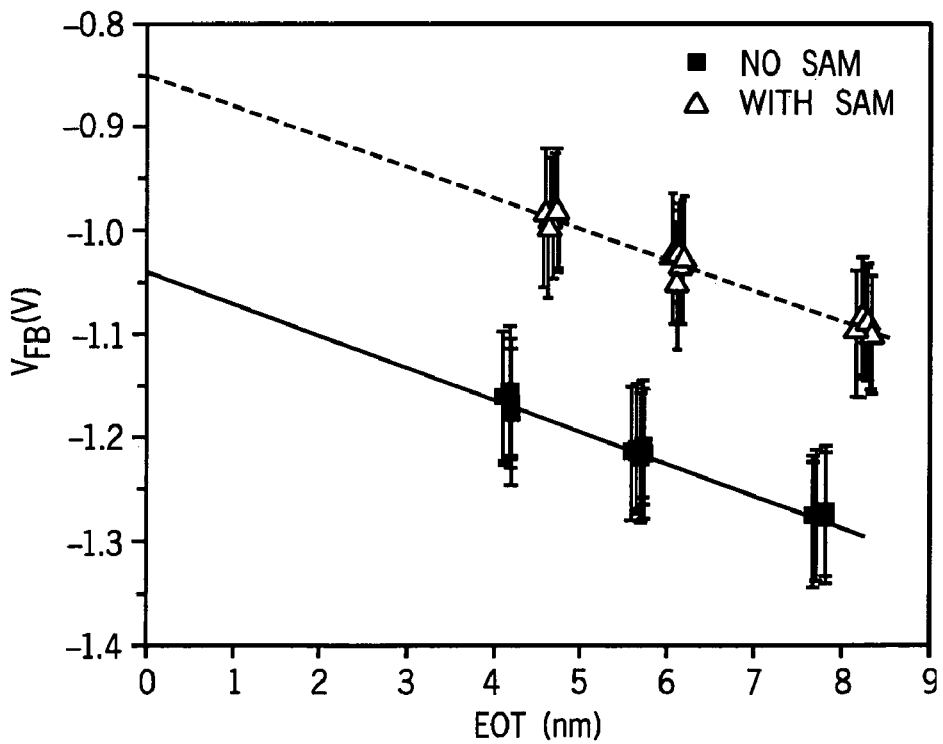

In order to estimate the $\phi_m$ of Ti on bare $SiO_2$ surface as well on $SiO_2$ surface covered with SAM at saturated surface coverage, $V_{FB}$ and $EOT_{total}$ were calculated from C-V plots determined in Ti/$SiO_2$/p$^+$-Si and Ti/SAM/$SiO_2$/p$^+$-Si configurations, respectively. FIG. 6 illustrates plots of $V_{FB}$ versus EOT. The slopes of the fitted lines corresponded to fixed charge density ($N_f$) and were identical. Also, the charge in the SAM had no effect on $N_f$ because $t_{SAM}$ was small compared to $t_{SiO2}$ and the dipole charge was close to the surface (i.e., images all of its charge in the metal). If it is assumed that $N_f$ is located at the $SiO_2$/Si interface, the intercept corresponds to the difference in $\phi_m$ between Ti and Si (i.e., intercept, $\phi_{MS} = \phi_M - \phi_{Si}$). Since the doping concentration (6×10$^{15}$/cm$^3$), electron affinity (4.05 eV), and band gap of Si (1.12 eV) are known, $\phi_{Si}$ is calculated to be 4.95. eV. Therefore, $\phi_{Ti}$ in Ti/$SiO_2$/p$^+$-Si configuration and Ti/SAM/$SiO_2$/p$^+$-Si configuration is calculated to be 3.9 eV and 4.1 eV, respectively. This result clearly demonstrates that (a) the increase in $\phi_{Ti}$ is attributed to the presence of dipolar SAM molecules at the Ti/$SiO_2$ interface, and (b) there is enormous potential for the fabrication of both NMOS and PMOS devices.

Figure 7:
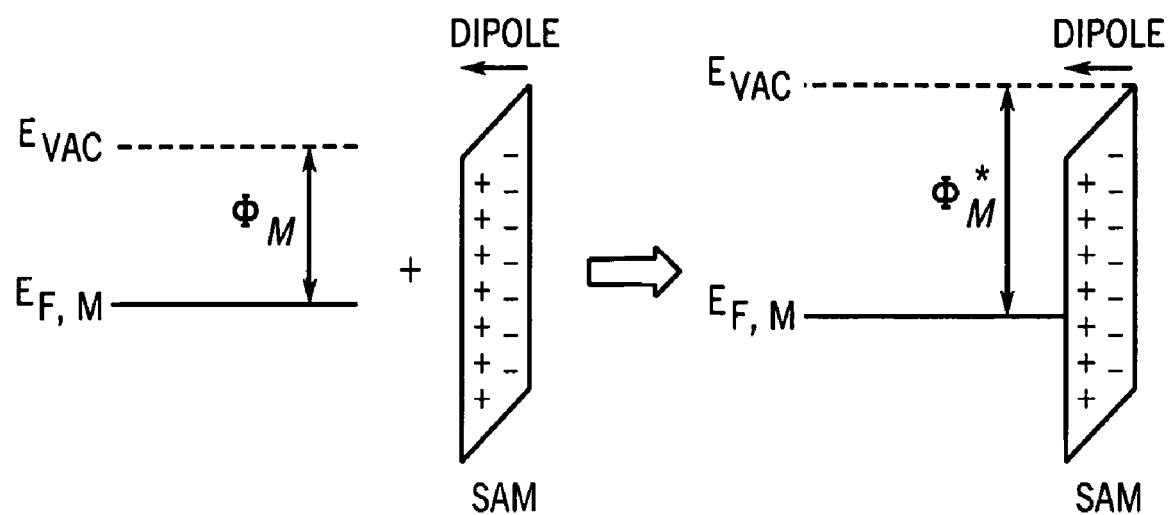
FIG. 7 illustrates how the metal work function improved due to the change in the electric potential at the interface in the presence of dipolar SAM molecules.

The increase of $\phi_{Ti}$ in the presence of dipolar SAM (APTES) molecules may be explained with the schematic in FIG. 7. The reaction of APTES with the hydroxyl-terminated $SiO_2$ surface forces the direction of the dipole moment to be outward, i.e., outward from the $SiO_2$ surface towards Ti. Therefore, the gradient in the potential ($\phi_{dipole}$) across this dipole layer changes the surface potential at the Ti/SAM interface, thereby increasing $\phi_{Ti}$ by this amount, i.e., $\phi_M^* = \phi_M + \phi_{dipole}$, which is equivalent to applying a positive electric field to the Ti to lower its Fermi level. The measured $\phi_{Ti}$ could deliberately be decreased with the use of another SAM that exhibits a dipole moment in the opposite direction.

Using the teachings above, the change in the magnitude of $\phi_M$ (in either direction) can be tailored by changing the magnitude of the dipole moment and its direction on a solid surface, as well as the degree of surface coverage of SAM and their tilt relative to the surface normal.

There are a number of biological molecules that can be used as SAM, examples of which are shown below with the building blocks they form and the driving force for self assembly. This list is not intended to be exclusive, merely illustrative of the possibilities.

List of SAMs

| Examples of SAM | Building Blocks | Driving Force for Self Assembly |
|---|---|---|
| Monolayers of fatty acids | Long-chain n-alkanoic acids ($C_nH_{2n+1}COOH$): ($CH_3(CH_2)_{20}COOH$) | Formation of surface salt between carboxylate anion and surface metal cation. |
| Monolayers of organosilicon derivatives | Alkylchlorosilanes, Alkylalkoxysilanes, alkylaminosilanes. | Formation of polysiloxane. |
| Organosulfur adsorbates on metal and semiconductor surfaces | Organosulfur compounds: n-alkyl sulfide, di-n-alkyl disulfides, thiophenols, mercaptopyridines, mercaptoanilines, thiophenes, cysteines, xanthates, thiocarbaminates | Strong affinity to transition metal surfaces. |
| Alkyl monolayers on silicon | Alkyl chains | Formation of C—Si bonds |
| Multilayers of diphosphates | α,ω-alkylidene diphosphate, 1,4-benzene, 4-4'-biphenyl, quaterthienyl, 7,8-dicyano-7,8-bis(o-pyridyl)-p-benzoquinonedimethide, bypiridine salts, porphyrins. | Formation of alkyl phosphonic acid by replacing the OH with an alkyl chain. |

The following metals can be used in the current invention. The deposition methods include physical vapor deposition (PVD), Atomic layer deposited (ALD), and chemical vapor deposition (CVD) This list is not intended to be exclusive, merely illustrative of the possibilities.

List of Metals

| Electrode Material | Work Function (eV) | Deposition Method | Gate Oxide |
|---|---|---|---|
| Ta | 4.80* | — | — |
|  | 4.25-4.72** | PVD | $Ta_2O_5$ (CVD) |
|  | 4.25* | — | — |
|  | 4.19 | — | — |
|  | 4.15* | — | — |
|  | 4.00* | — | — |
| TaN | 4.55-5.4** | PVD | $Ta_2O_5$ (CVD) |
|  | 4.15 | PVD | $HfO_2$ (PVD) |
|  | — | — | — |
| $TaSi_xN_y$ | 4.4 | PVD | $HfO_2$ (CVD) |
|  | 4.19-4.27 | PVD | $SiO_2$ (thermal) |
| Ti | 4.56 | PVD | $Si_3N_4$ (CVD) |
|  | 4.33 | — | — |
|  | 4.2-4.6 | — | — |
|  | 3.91-4.17** | PVD | $Ta_2O_5$ (CVD) |
|  | 3.9 | PVD | $SiO_2$ |
| TiN | 5.3 | ALD | $SiO_2$ (thermal) |
|  | 4.95 | — | — |
|  | 4.80-4.95** | PVD | $Ta_2O_5$ (CVD) |
|  | 4.8 | CVD | $HfO_2$ (CVD) |
|  |  | PVD | $SiO_2$ (thermal) |
|  | 4.75 | CVD | $SiO_2$ |
|  | 4.6 | PVD | — |
|  | 4.44-4.55 | PVD | $SiO_xN_y$ |
|  | 4.4 | PVD | — |
| $TiAl_xN_y$ | 5.0-5.2 | PVD | $SiO_2$ |
| Ni | 5.35* | — | — |
|  | 5.3 | PVD | $SiO_2$ |
|  | 5.22* | — | — |
|  | 5.15* | — | — |
|  | 5.04* | — | — |
| Co | 5.0* | — | — |
|  | 4.40 | — | — |
| W | 5.25* | — | — |
|  | 4.74-4.77** | PVD | $Ta_2O_5$ (CVD) |
|  | 4.63* | — | — |
|  | 4.55-4.75 | — | — |
|  | 4.55* | — | — |
|  | 4.52 | — | — |
|  | 4.47* | — | — |
|  | 4.3* | — | — |
|  | 4.18* | — | — |
| $WN_x$ | 5.0 | — | — |
|  | 4.76-5.00** | PVD | $Ta_2O_5$ (CVD) |
| Mo | 5.05 | PVD | $SiO_2$ |
| Mo | 4.95* | — | — |
|  | 4.94 | PVD | $ZrO_2$ |
|  | 4.79 | PVD | $ZrSiO_4$ |
|  | 4.76 | PVD | $Si_3N_4$ |
|  | 4.72 | PVD | $Si_3N_4$ |
|  | 4.64-4.94** | PVD | $Ta_2O_5$ (CVD) |
|  | 4.6 | — | — |
|  | 4.55* | — | — |
|  | 4.53-4.95*** | PVD | — |
|  | 4.53* | — | — |
|  | 4.50* | — | — |
|  | 4.36* | — | — |
|  | 4.20 | — | — |
| MoN | 5.33 | — | — |
|  | 4.7-5.33** | PVD | $Ta_2O_5$ (CVD) |
| Ru | 4.71* | — | — |
| Ru—Ta | 4.2-5.1** | PVD | $SiO_2$ $ZrO_2$ |
| $RuO_2$ | 5.1 | PVD | $ZrO_2$ $ZrSiO_4$ |
|  | 5.04 | PVD | $SiO_2$ (thermal) |
|  | 5.0 | — | — |
| Ir | 5.76* | — | — |
|  | 5.67* | — | — |
|  | 5.42* | — | — |
|  | 5.27 | — | — |
|  | 5.00* | — | — |
| $IrO_2$ | 5.0 | — | — |
| Pt | 5.7* | — | — |
|  | 5.65* | — | — |
|  | 5.34 | — | — |
| Al | 4.41* | — | — |
|  | 4.28* | — | — |
|  | 4.24* | — | — |
|  | 4.1 | — | — |
|  | 4.06* | — | — |
| $TaSi_2$ | 4.15 | — | — |
| $TiSi_2$ | 3.67-4.25 | — | — |
| $WSi_2$ | 4.55-4.8 | — | — |
| $MoSi_2$ | 4.6-4.9 | — | — |
| Cr | 4.6 | — | — |
|  | 4.5* | — | — |
| Pd | 5.6* | — | — |
|  | 5.12* | — | — |
|  | 4.98 | — | — |

-continued

| Electrode Material | Work Function (eV) | Deposition Method | Gate Oxide |
|---|---|---|---|
| Re | 5.75 | — | — |
|  | 5.1 | — | — |
|  | 4.96 | — | — |
| Zr | 4.05* | — | — |
| Hf | 3.9* | — | — |

It should be understood that the invention is not limited to the particular embodiments described herein, but that various changes and modifications may be made without departing from the spirit and scope of this novel concept as defined by the following claims.

What is claimed is:

1. A method for modifying the capacitance, leakage current, and/or flat band voltage of a metal-insulator-semiconductor structure via a change in the work function of the metal, contacting a layer having an OH-terminated oxide surface with a solution comprising organic molecules having a permanent dipolar moment and selected from the group consisting of aminopropyltriethoxysilane, fatty acids, organosilicon derivatives, organosulfur compounds, alkyl chains, diphosphates, and combinations thereof, for a predetermined period of time to form a self-assembled organic layer over the OH-terminated oxide surface; and forming a further layer comprising metal over the self-assembled organic layer to form a metal-insulator-semiconductor structure having a capacitance, a leakage current, and a flat band voltage, wherein the capacitance, the flat band voltage, or the leakage current is modified by selection of the predetermined period of time or by selection of the magnitude or the direction of the permanent dipolar moment of the organic molecules.

2. The method of claim 1, wherein the layer and the further layer independently comprise Ta, Ti, Ni, Co, W, Mo, Ru, Ir, Pt, Al, Cr, Pd, Re, Zr, Hf, or mixtures thereof.

3. The method of claim 1, wherein the OH-terminated oxide surface comprises $HfO_2$, $(Ba,Sr)TiO_3$, $Pb(Zr,Ti)O_3$, or $SiO_2$.

4. The method of claim 1, wherein the self-assembled organic layer is formed directly on the OH-terminated oxide surface of the layer and the organic molecules comprise the organosilicon derivatives.

5. The method of claim 4, wherein the organosilicon derivatives are selected from the group consisting of alkylchlorosilanes, alkylalkoxysilanes, alkylaminosilanes, and mixtures thereof.

6. The method of claim 1, wherein the self-assembled organic layer is formed directly on the OH-terminated oxide surface of the layer and the organic molecules comprise aminopropyltriethoxysilane.

7. The method of claim 1, wherein the self-assembled organic layer is formed directly on the OH-terminated oxide surface of the layer and the organic molecules comprise diphosphates.

8. The method of claim 7, wherein the organic molecules are selected from the group consisting of $\alpha$, $\omega$-alkylidene diphosphate, 1,4-benzene, 4-4'-biphenyl, quaterthienyl, 7,8-dicyano-7,8-bis(o-pyridyl)-p-benzoquinonedimethide, bipyridine salts, porphyrins, and mixtures thereof.

9. The method of claim 1, further comprising exposing the layer to isopropyl alcohol and/or acetone, boiling water, or a plasma prior to contacting the layer with the solution comprising organic molecules.

* * * * *